(12) United States Patent
Wu et al.

(10) Patent No.: US 10,791,635 B2
(45) Date of Patent: Sep. 29, 2020

(54) FIXING MECHANISM AND RELATED ELECTRONIC APPARATUS

(71) Applicant: Wistron Corporation, New Taipei (TW)

(72) Inventors: Yu-Jian Wu, New Taipei (TW); Zhi-Tao Yu, New Taipei (TW); Chia-Hsin Liu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/391,323

(22) Filed: Apr. 23, 2019

(65) Prior Publication Data

US 2020/0229311 A1 Jul. 16, 2020

(30) Foreign Application Priority Data

Jan. 11, 2019 (CN) .......................... 2019 1 0026367

(51) Int. Cl.
*H05K 7/20* (2006.01)
*H05K 5/00* (2006.01)
*H05K 7/14* (2006.01)

(52) U.S. Cl.
CPC ......... *H05K 5/0013* (2013.01); *H05K 7/1405* (2013.01)

(58) Field of Classification Search
CPC ... H05K 5/0013; H05K 5/0026; H05K 5/0269
USPC ................. 361/724–726, 736, 737, 740, 752
See application file for complete search history.

(56) References Cited

U.S. PATENT DOCUMENTS

| 5,338,214 A * | 8/1994 | Steffes | .................... G06F 1/184 361/679.32 |
| 5,544,006 A * | 8/1996 | Radloff | .................. G06F 1/184 174/138 G |
| 6,118,668 A * | 9/2000 | Scholder | ................. G06F 1/184 361/679.32 |
| 7,265,996 B2 * | 9/2007 | Fan | ...................... H05K 7/1408 312/223.2 |

(Continued)

FOREIGN PATENT DOCUMENTS

| TW | 201204220 A1 | 1/2012 |
| TW | 201228535 A1 | 7/2012 |
| TW | I531296 B | 4/2016 |

*Primary Examiner* — Anthony Q Edwards
(74) *Attorney, Agent, or Firm* — Winston Hsu

(57) ABSTRACT

A fixing mechanism is used to fix a first electronic component to a second electronic component of an electronic apparatus. The fixing mechanism includes a detachable frame, a constraining component, a combining component and an actuating component. The first electronic component is assembled with the detachable frame via a first plate portion of the detachable frame. The constraining component is movably disposed on the detachable frame. The constraining component abuts against the first plate portion. The combining component is disposed on the detachable frame and corresponds to a connecting component of the second electronic component. The actuating component is movably disposed on the detachable frame. The combining component and the connecting component are matched in a loose manner via the actuating component in a first position, and matched in a tight manner via the actuating component in a second position.

20 Claims, 12 Drawing Sheets

(56) References Cited

U.S. PATENT DOCUMENTS

| | | | | |
|---|---|---|---|---|
| 7,304,840 | B2* | 12/2007 | Chen | G06F 1/187 |
| | | | | 220/4.31 |
| 7,375,980 | B2* | 5/2008 | Peng | G06F 1/185 |
| | | | | 361/726 |
| 8,625,271 | B2* | 1/2014 | Lu | G06F 1/185 |
| | | | | 361/679.31 |
| 8,837,135 | B2* | 9/2014 | Zheng | G06F 1/185 |
| | | | | 361/679.31 |
| 10,095,281 | B2* | 10/2018 | Tsai | G11B 33/124 |
| 2006/0044767 | A1* | 3/2006 | Wu | G06F 1/184 |
| | | | | 361/725 |
| 2008/0259579 | A1* | 10/2008 | Chen | G06F 1/185 |
| | | | | 361/756 |
| 2011/0211315 | A1* | 9/2011 | Takeda | G03B 21/145 |
| | | | | 361/724 |
| 2013/0070421 | A1* | 3/2013 | Zhou | H05K 7/1417 |
| | | | | 361/724 |
| 2015/0104246 | A1* | 4/2015 | Chiang | H05K 7/1485 |
| | | | | 403/330 |
| 2018/0160558 | A1* | 6/2018 | Han | H05K 7/1412 |

\* cited by examiner

FIXING MECHANISM AND RELATED ELECTRONIC APPARATUS

BACKGROUND OF THE INVENTION

1. Field of the Invention

The present invention relates to a fixing mechanism and a related electronic apparatus, and more particularly, to a fixing mechanism for providing stable assembly, easy disassembly and quick releasing function and a related electronic apparatus.

2. Description of the Prior Art

A server apparatus may accommodate a plurality of electronic components, such as a hard disk, a network card, a display card and an expansion card. As an example of the hard disk, the conventional assembling process is locking a bridging component with a lock hole onto an edge of the hard disk, passing an external fixing component (such as a screw or a bolt) into the lock hole of the bridging component and a screw structure of a fixer when the hard disk is installed on the fixer inside the server apparatus, and utilizing an external tool (such as the screw driver or the spanner) to lock the external fixing component with the screw structure; the hard disk can be assembled with the fixer stably. For disassembling the hard disk from the fixer, the external tool is used to release the fixing component from the screw structure, and then the fixing component is removed from the lock hole of the bridging component to separate the hard disk from the fixer. The conventional assembling process has a drawback of complicate operation, so the user cannot assemble and disassemble the electronic component in a rapid and easy manner.

SUMMARY OF THE INVENTION

The present disclosure provides a fixing mechanism for providing stable assembly, easy disassembly and quick releasing function and a related electronic apparatus for solving above drawbacks.

According to the claimed disclosure, a fixing mechanism for fixing a first electronic component to a second electronic component having a connecting component is disclosed. The fixing mechanism includes a detachable frame, a combining component and an actuating component. The first electronic component is disposed on the detachable frame. The combining component is disposed on the detachable frame and corresponds to the connecting component. The actuating component is movably disposed on the detachable frame for being moved between a first position and a second position. The combining component is disassembled from the connecting component in response to the actuating component located at the first position, and the combining component is assembled with the connecting component in response to the actuating component located at the second position.

According to the claimed disclosure, the combining component includes at least two combining portions. The connecting component is a hole portion disposed on the second electronic component. A portion of the actuating component is inserted into the at least two combining portions to engage the at least two combining portions with the hole portion, and the portion is located between the at least two combining portions to prevent the at least two combining portions from resilient deformation in response to the actuating component located at the second position. Each of the at least two combining portions is a resilient hook, and the portion of the actuating component is a pin.

According to the claimed disclosure, the detachable frame includes two hooking portions and an opening structure. The actuating component inserts into the opening structure to accommodate inside the detachable frame. The actuating component includes a main body and a slot portion. A width of the main body is greater than a distance between the two hooking portions. The slot portion is disposed on a lateral side of the main body, and the main body is installed between the two hooking portions via the slot portion.

According to the claimed disclosure, the detachable frame includes two first engaging portions, and the actuating component includes a main body and a second engaging portion. An end of the second engaging portion is connected to the main body, and the other end of the second engaging portion is engaged with one of the two first engaging portions in a detachable manner.

According to the claimed disclosure, the detachable frame includes a first latching portion, and the actuating component includes a main body and a second latching portion. An end of the second latching portion is connected to the main body, and the other end of the second latching portion is engaged with the first latching portion to set the actuating component on a specific position of the detachable frame.

According to the claimed disclosure, the detachable frame includes a first contacting portion, and the actuating component includes a main body and a second contacting portion. The second contacting portion is disposed on a bottom of the main body and used to contact against the first contacting portion for constraining a movement of the actuating component relative to the detachable frame.

According to the claimed disclosure, the detachable frame includes a first plate portion and a second plate portion connected to each other in a bending manner. The first electronic component is disposed on the detachable frame via the first plate portion. A circuit board having a connector is disposed on the second plate portion. The first electronic component is assembled with the first plate portion and inserted into the connector, and the actuating component is disposed on the second plate portion and able to move relative to the second plate portion.

According to the claimed disclosure, the detachable frame includes at least one guiding portion, a protruding portion and a resisting portion. The guiding portion slidably contacts against a supporting portion of a casing to assemble with the casing. The protruding portion is movably inserted into a piercing hole structure of the casing to position the detachable frame onto the casing. The resisting portion is used to contact against a restraining portion of the casing to restrain a movement of the detachable frame relative to the casing.

According to the claimed disclosure, the actuating component drives the combining component to engage with the connecting component in a tight fit manner when the actuating component is located at the second position. The actuating component includes a main body and a handling portion. The handling portion is connected to the main body in a bending manner. The handling portion is driven by an external force to move the actuating component between the first position and the second position.

According to the claimed disclosure, the fixing mechanism further includes a constraining component movably disposed on the detachable frame. The constraining component is adapted to stand by the detachable frame for constraining a movement of the first electronic component relative to the detachable frame.

According to the claimed disclosure, an electronic apparatus includes a casing, a first electronic component, a second electronic component and a fixing mechanism. The second electronic component is disposed inside the casing and has a connecting component. The fixing mechanism is used to fix the first electronic component to the second electronic component. The fixing mechanism includes a detachable frame, a combining component and an actuating component. The first electronic component is disposed on the detachable frame. The combining component is disposed on the detachable frame and corresponds to the connecting component. The actuating component is movably disposed on the detachable frame for being moved between a first position and a second position. The combining component is disassembled from the connecting component in response to the actuating component located at the first position, and the combining component is assembled with the connecting component in response to the actuating component located at the second position.

According to the claimed disclosure, the electronic apparatus further includes a vibration absorbing component and an auxiliary component. The vibration absorbing component includes a clamping portion and a positioning portion. The first electronic component includes a bridging portion. The bridging portion is inserted into the clamping portion to constrain a movement along at least one direction. The positioning portion is used to constrain a movement of the bridging portion relative to the clamping portion in a resiliently deformable manner. The auxiliary component is disposed inside the casing. The vibration absorbing component is engaged with at least one abutting portion of the auxiliary component in a detachable manner.

The electronic apparatus of the present disclosure can dispose the second electronic component inside the casing; the first electronic component can be assembled with the fixing mechanism for a start, and then electrically connected to the second electronic component because the fixing mechanism is installed inside the casing. The second electronic component can be a circuit board with common standard or specific standard. The fixing mechanism is designed for general purpose, and can be used to hold the first electronic component with any standard. As the first electronic component is a graphics processing unit (GPU), the detachable frame of the fixing mechanism can be used to hold one GPU. As the first electronic component is other interface card, the detachable frame may have one layer or plural layers for holding one or more interface cards. As a structural height of the detachable frame is changed, a length of the actuating component can be varied accordingly. The fixing mechanism of the present disclosure has advantages of simple structure and easy operation. The electronic apparatus can utilize the fixing mechanism to assemble the first electronic component with the second electronic component for economizing inner space of the casing. Moreover, the fixing mechanism can hold a variety of electronic components, so as to effectively increase market competition of the electronic apparatus.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
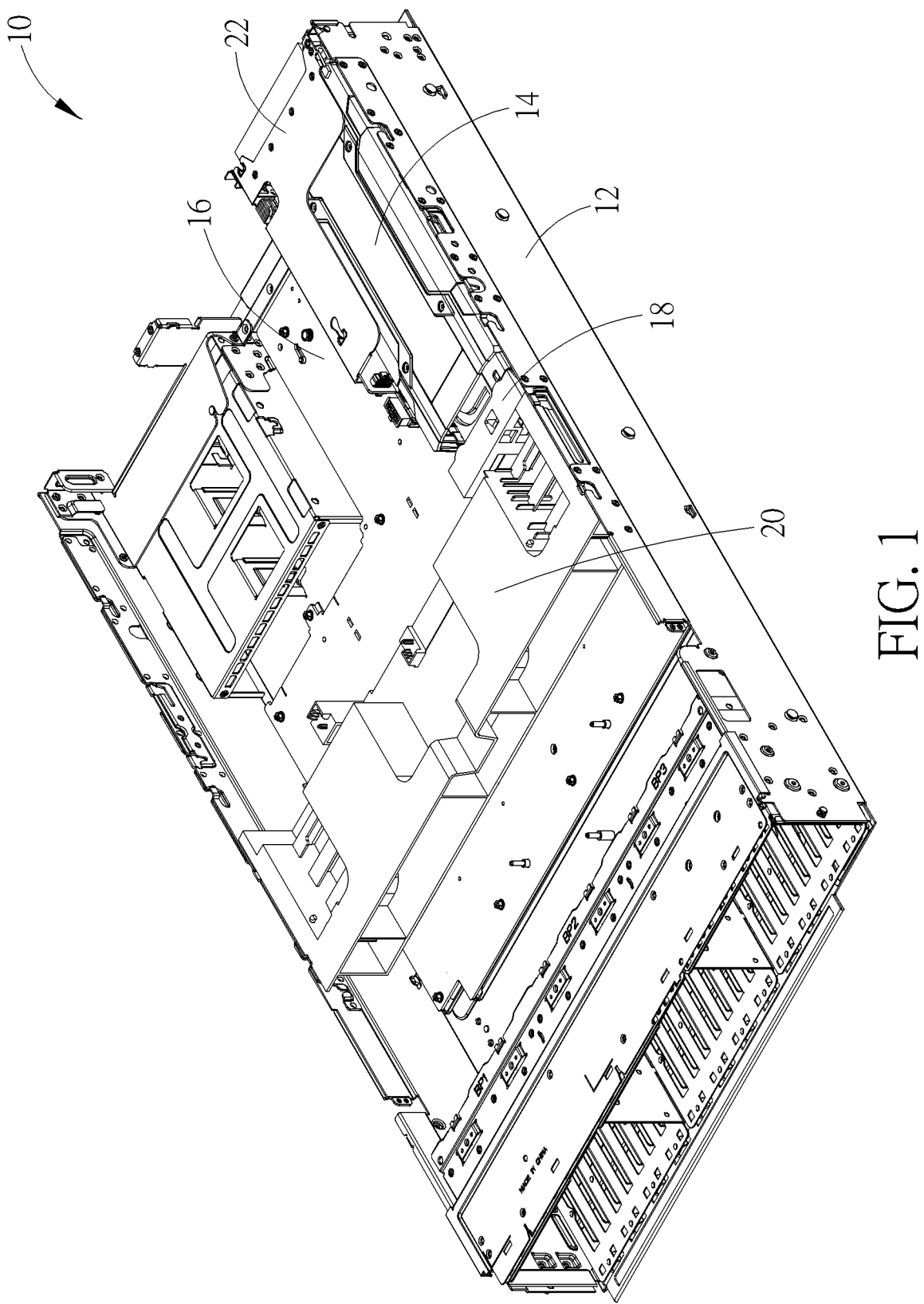
FIG. 1 is an assembly diagram of an electronic apparatus according to an embodiment of the present disclosure.
Figure 2:
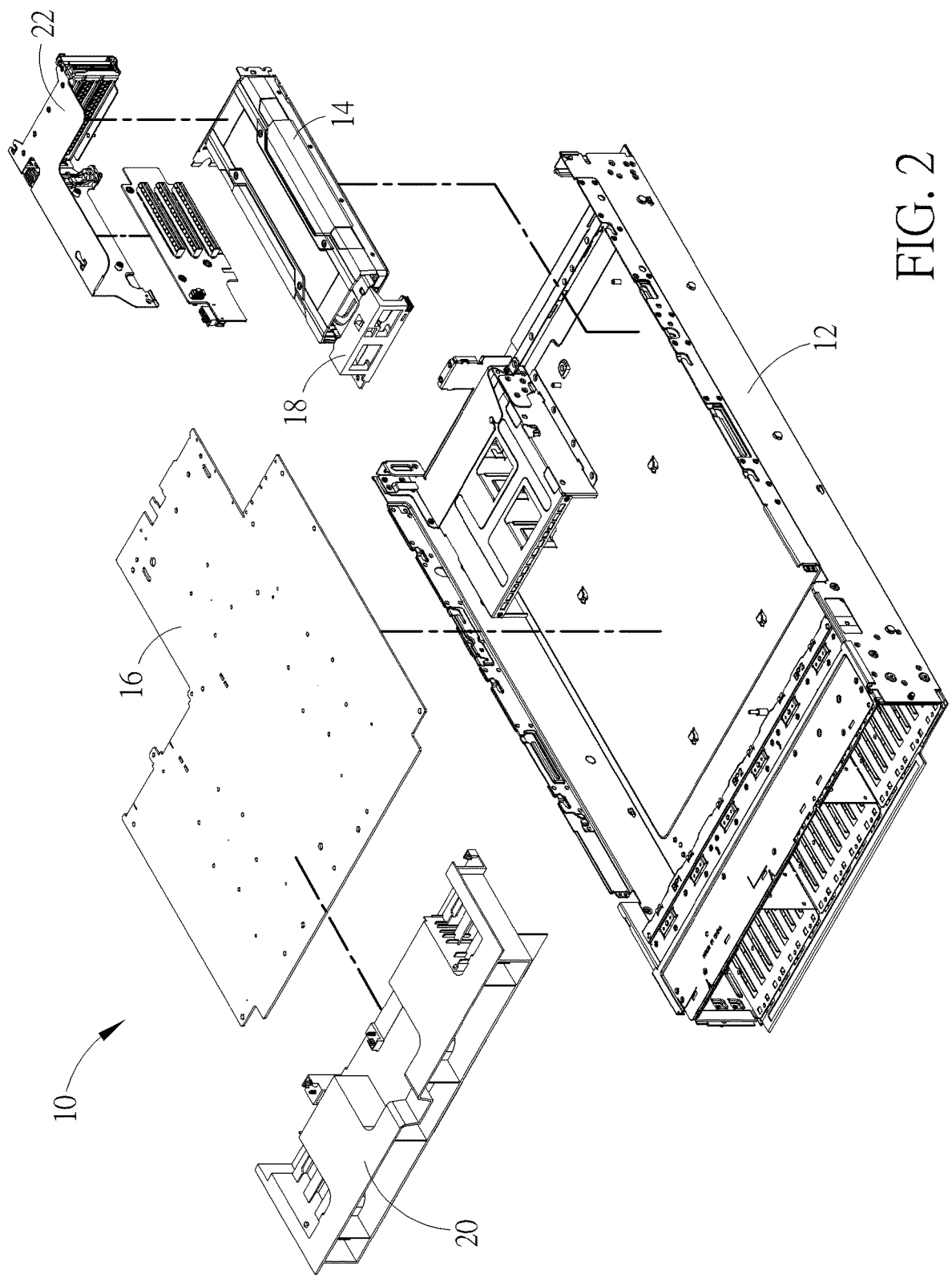
FIG. 2 is an exploded diagram of the electronic apparatus according to the embodiment of the present disclosure.

Please refer to FIG. 1 and FIG. 2. FIG. 1 is an assembly diagram of an electronic apparatus 10 according to an embodiment of the present disclosure. FIG. 2 is an exploded diagram of the electronic apparatus according to the embodiment of the present disclosure. The electronic apparatus 10 can include a casing 12, a first electronic component 14, a second electronic component 16, a vibration absorbing component 18, an auxiliary component 20 and a fixing mechanism 22. The vibration absorbing component 18 is an optional unit according to a design demand. If dimensions of the first electronic component 14 is small and the first electronic component 14 cannot contact the auxiliary component 20 when being installed inside the casing 12, the vibration absorbing component 18 can be disposed between the first electronic component 14 and the auxiliary component 20 to prevent the first electronic component 14 from over-shaking and low efficiency. The fixing mechanism 22 can be used to fix the first electronic component 14 to the second electronic component 16; for example, the first electronic component 14 can be assembled with the fixing mechanism 22 and then installed on second electronic component 16. The first electronic component 14 and the second electronic component 16 can be assembled with and disassembled from each other without any extra tools, and therefore the electronic apparatus 10 can provide quick releasing function.

Figure 3:
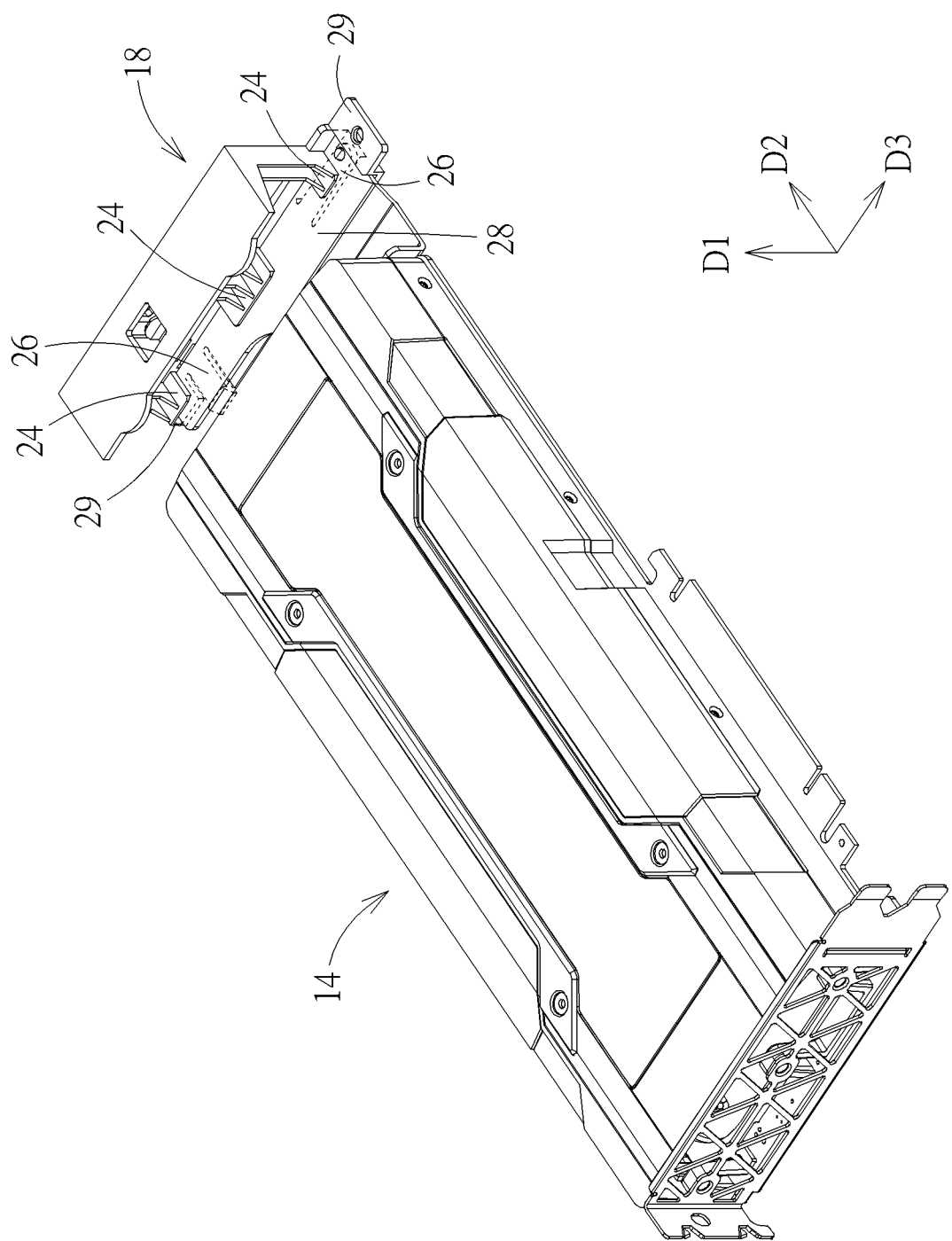
FIG. 3 is an assembly diagram of a first electronic component and a vibration absorbing component according to the embodiment of the present disclosure.
Figure 4:
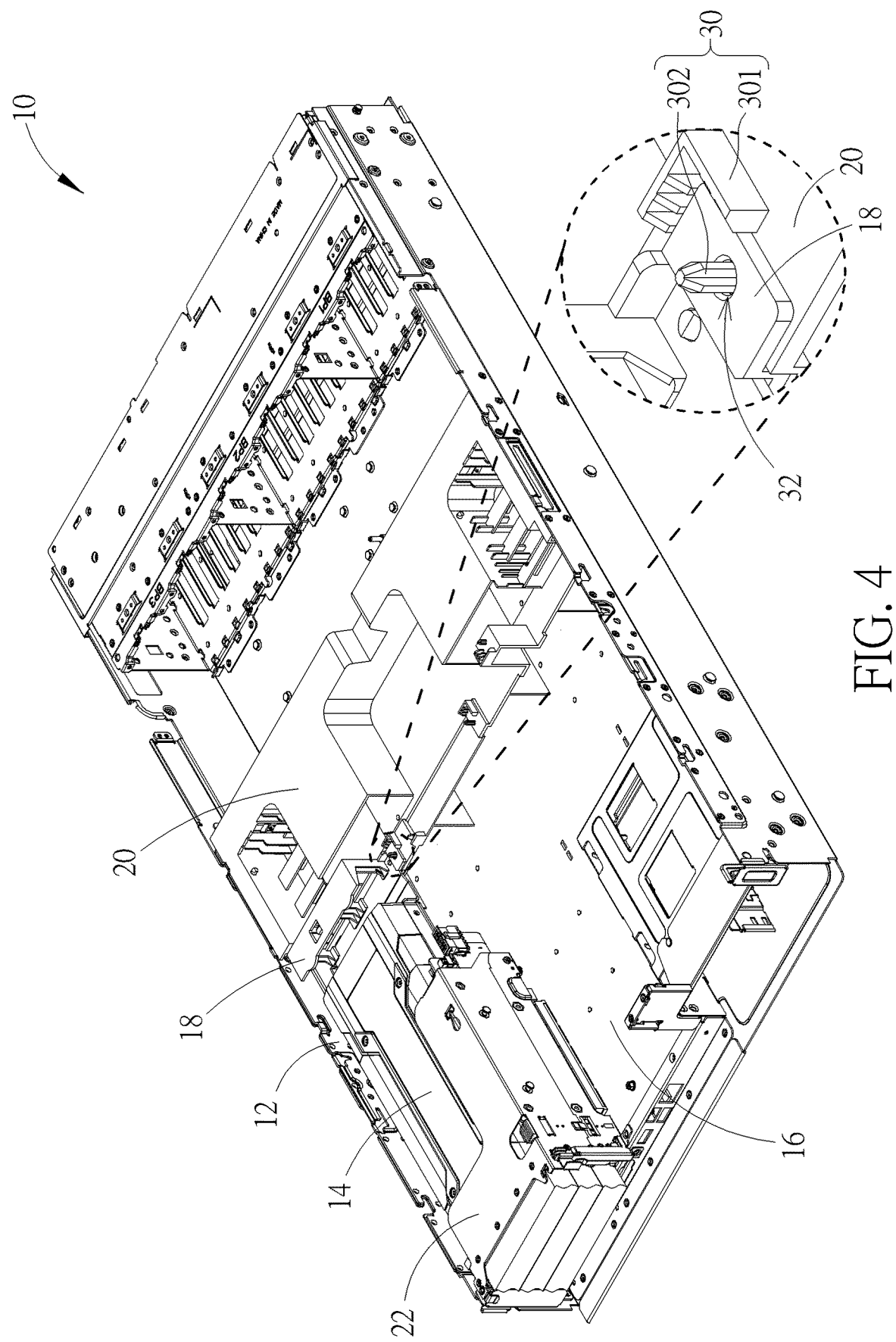
FIG. 4 is an assembly diagram of the vibration absorbing component and an auxiliary component according to the embodiment of the present disclosure.

Please refer to FIG. 3 and FIG. 4. FIG. 3 is an assembly diagram of the first electronic component 14 and the vibration absorbing component 18 according to the embodiment of the present disclosure. FIG. 4 is an assembly diagram of the vibration absorbing component 18 and the auxiliary component 20 according to the embodiment of the present disclosure. As shown in FIG. 3, the vibration absorbing component 18 can have one or a plurality of clamping portions 24 and positioning portions 26. The first electronic component 14 can have a bridging portion 28. The clamping portion 24 may have two plates used to clamp the bridging portion 28. The positioning portion 26 is buckled with the bridging portion 28. Shapes of the clamping portion and the positioning portion 26 are not limited to the above-mentioned embodiment, which depend on design demand. A movement of the first electronic component 14 along a first direction D1 can be constrained when the bridging portion 28 is inserted into the clamping portion 24. A movement of the first electronic component 14 along a second direction D2 can be constrained when the bridging portion 28 is buckled with the positioning portion 26 in a resiliently deformable manner. A movement of the first electronic component 14 along a third direction D3 can be constrained when a plurality of stopping portions 29 of the vibration absorbing component 18 is used to stop two opposite sides of the first electronic component 14.

In respect of assembly and disassembly about the vibration absorbing component 18 and the auxiliary component 20, as shown in FIG. 4, the auxiliary component 20 can have a plurality of abutting portions 30 respectively disposed on several places for abutting against corners of the vibration absorbing component 18. The abutting portion 30 can include an abutting rib 301 and a positioning bolt 302. Amounts, positions and relation between the abutting rib 301 and the positioning bolt 302 are not limited to this embodiment, and depend on design demand. The positioning bolt 302 can pass through a hole 32 on the vibration absorbing component 18. The abutting rib 301 can surround sides of the corner of the vibration absorbing component 18. The vibration absorbing component 18 can be lifted to disengage from the abutting rib 301 and the positioning bolt 302, which means the vibration absorbing component 18 is engaged with the abutting portion 30 of the auxiliary component 20 in a detachable manner.

Figure 5:
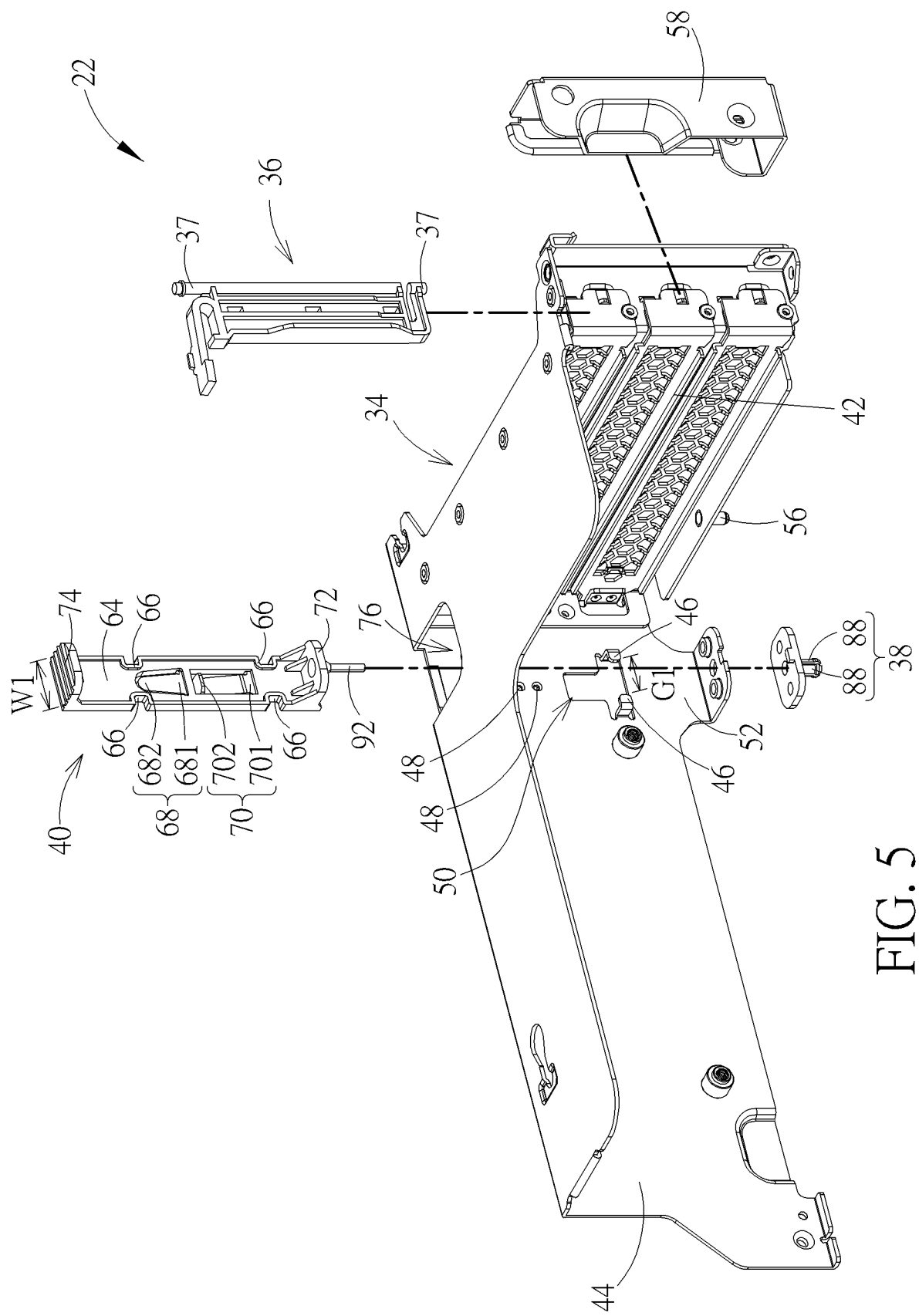
FIG. 5 and FIG. 6 are exploded diagrams of a fixing mechanism in different views according to the embodiment of the present disclosure.
Figure 6:
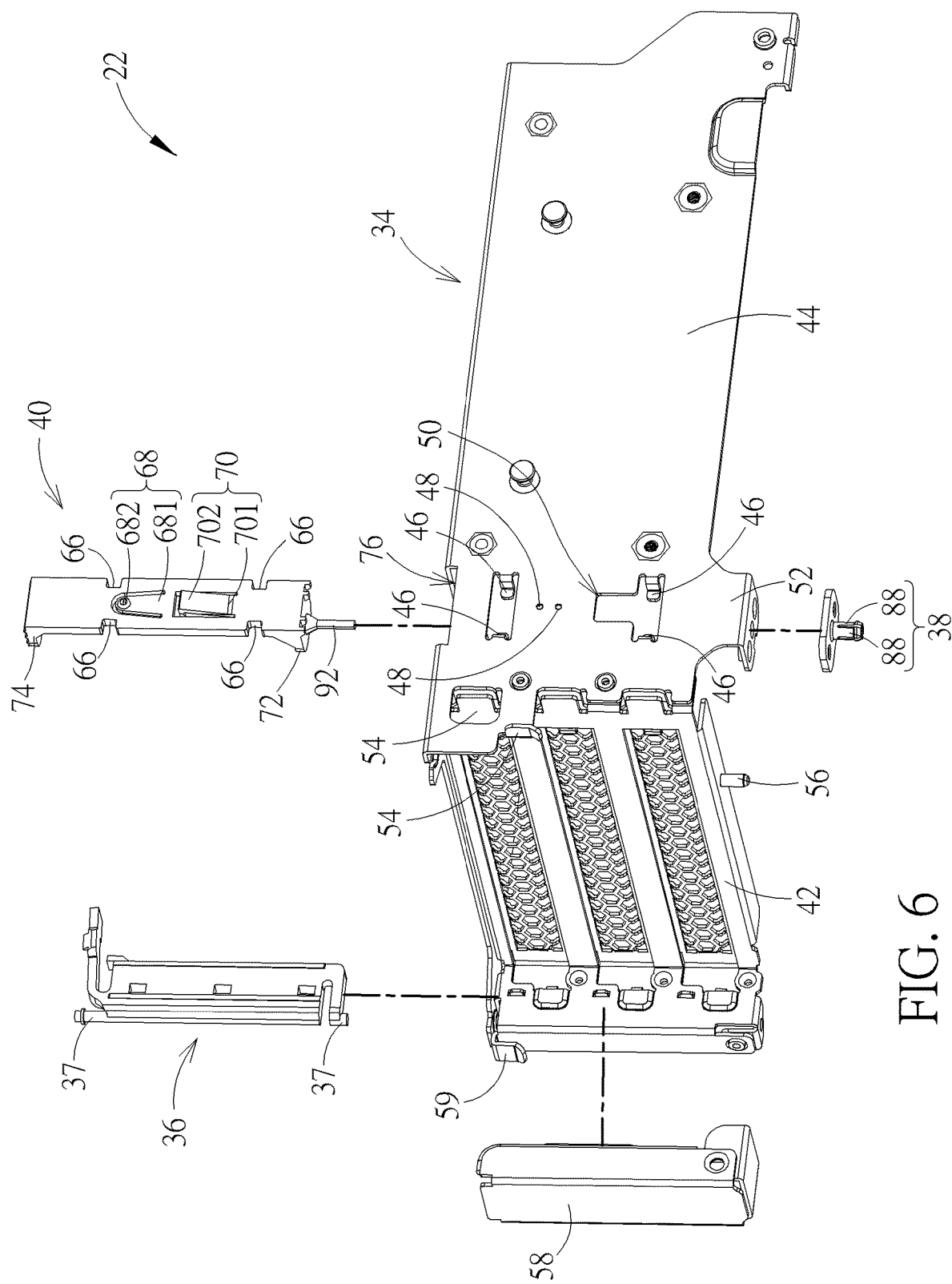

Please refer to FIG. 5 and FIG. 6. FIG. 5 and FIG. 6 are exploded diagrams of the fixing mechanism 22 in different views according to the embodiment of the present disclosure. The fixing mechanism 22 can include a detachable frame 34, a constraining component 36, a combining component 38 and an actuating component 40. The constraining component 36 can be rotatably disposed on the detachable frame 34 via a shaft 37. The combining component 38 is disposed on the detachable frame 34. The actuating component 40 is movably disposed on the detachable frame 34 and can drive the combining component 38 to be resiliently deformed. The detachable frame 34 can include a first plate portion 42, a second plate portion 44, a hooking portion 46, a first engaging portion 48, a first latching portion 50, a first contacting portion 52, a guiding portion 54, a protruding portion 56 and a resisting portion 58. The first plate portion 42 and the second plate portion 44 are connected to each other in a bending manner. The constraining component 36 can be rotatably disposed on a side of the first plate portion 42. The hooking portion 46 can be disposed on the second plate portion 44. The first engaging portion 48 and the first latching portion 50 can be disposed on the second plate portion 44 with the hooking portion 46. The combining component 38 can be disposed on the detachable frame 34 via the first contacting portion 52. The first contacting portion 52 can be used to hold the actuating component 40, so that a portion 92 of the actuating component 40 can insert into a hole on the first contacting portion 52 to contact the combining component 38. The portion 92 can be a pin. The guiding portion 54 and the resisting portion 58 can be preferably disposed on two opposite sides of the first plate portion 42. The resisting portion 58 can be fixed to the first plate portion 42 via a hook 59. The protruding portion 56 can be disposed on a bottom of the detachable frame 34.

The actuating component 40 can include a main body 64, a slot portion 66, a second engaging portion 68, a second latching portion 70, a second contacting portion 72 and a handling portion 74. The slot portion 66 can be disposed on a lateral side of the main body 64. A width W1 of the main body 64 can be greater than a distance G1 between free ends of two opposite hooking portions 46, so that the slot portion 66 can align with the hooking portion 46 to install the actuating component 40 into a constraint range of the hooking portion 46, which means the actuating component 40 can be disposed between the hooking portion 46 and a plate surface of the second plate portion 44. In the embodiment of the present disclosure, the second engaging portion 68 can be a resilient arm; however, an actual application is not limited to the above-mentioned embodiment. An end 681 of the second engaging portion 68 can be connected to the main body 64, and the other end 682 of the second engaging portion 68 can be optionally engaged with one of the two first engaging portions 48 in a detachable manner. When the actuating component 40 is lifted, the second engaging portion 68 can be engaged with the upper first engaging portion 48; when the actuating component 40 is descended, the second engaging portion 68 can be engaged with the lower first engaging portion 48. Engagement of the first engaging portions 48 and the second engaging portion 68 can provide preferred hand feeling. In another possible embodiment, the detachable frame 34 may have three or more than three first engaging portions 48. When the actuating component 40 is vertically moved relative to the detachable frame 34, the second engaging portion 68 can be sequentially engaged with a corresponding one of the first engaging portions 48 for reminding the actuating component 40 is moved to a specific height.

Generally, the second latching portion 70 can be a resilient arm component. An end 701 of the second latching portion 70 can be connected to the main body 64, and the other end 702 of the second latching portion 70 can be optionally engaged with the first latching portion 50 according to relation between the actuating component 40 and the detachable frame 34, so as to set the actuating component 40 at a specific position on the detachable frame 34. The actuating component 40 can be constrained inside the detachable frame 34 via engagement of the first latching portion 50 and the second latching portion 70. The second contacting portion 72 can be disposed on a bottom of the main body 64. The portion 92 can be disposed on the second contacting portion 72. When the actuating component 40 is moved downward, the second contacting portion 72 can contact against the first contacting portion 52, so as to constrain a movement of the actuating component 40 relative to the detachable frame 34 for avoiding over-pressing. The handling portion 74 can be connected to the main body 64 in a bending manner. The handling portion 74 can be exposed via an opening structure 76 formed on the detachable frame 34. An inner space arrangement of the fixing mechanism 22 can be effectively economized when the actuating component 40 is inserted into the opening structure 76 for accommodating inside the detachable frame 34. A user's finger can pass into the opening structure 76 for pressing or pushing the handling portion 74, and the actuating component 40 can be driven to move relative to the detachable frame 34 for lifting and descending.

Figure 7:
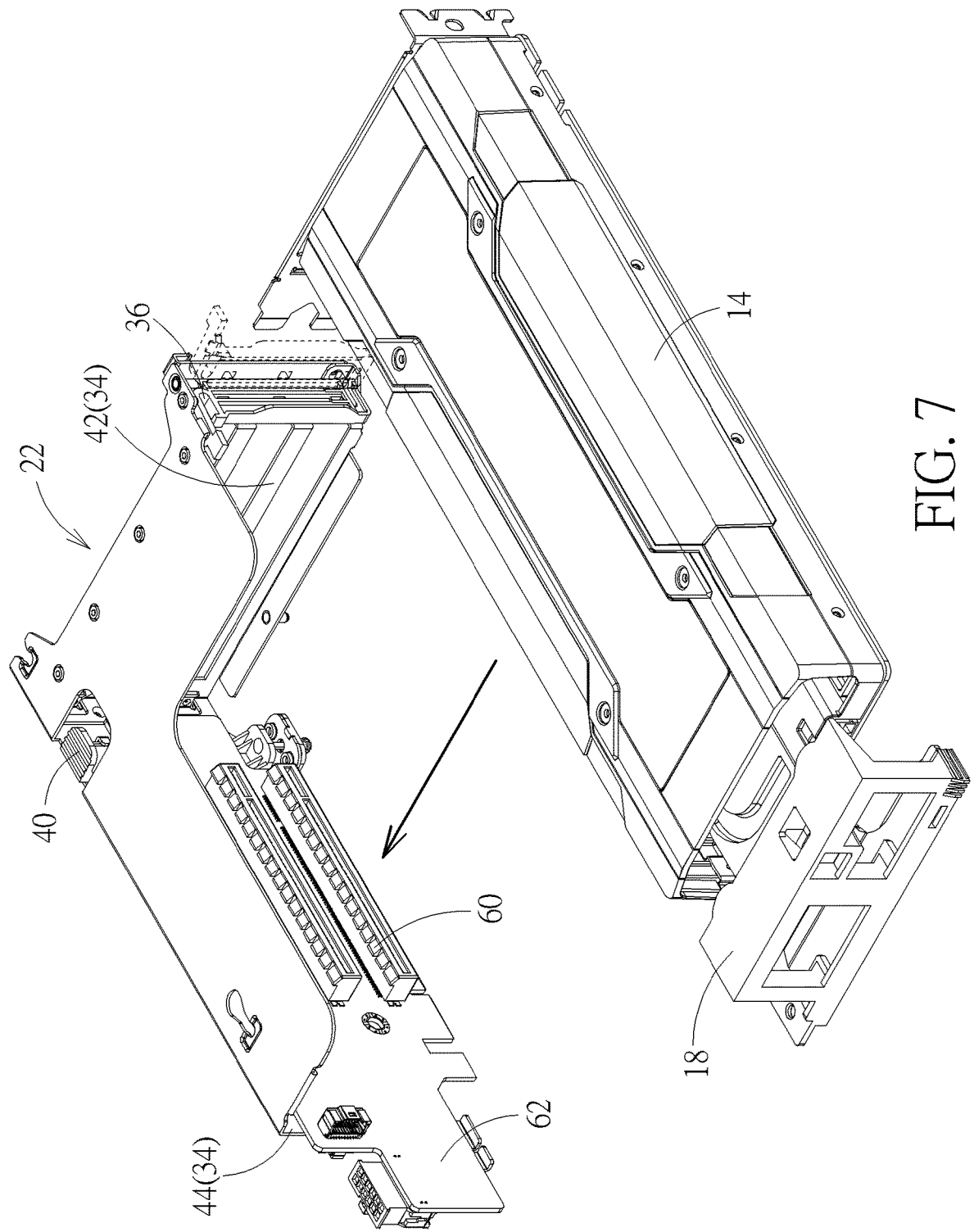
FIG. 7 is an assembly diagram of the fixing mechanism and the first electronic component 14 according to the embodiment of the present disclosure.
Figure 8:
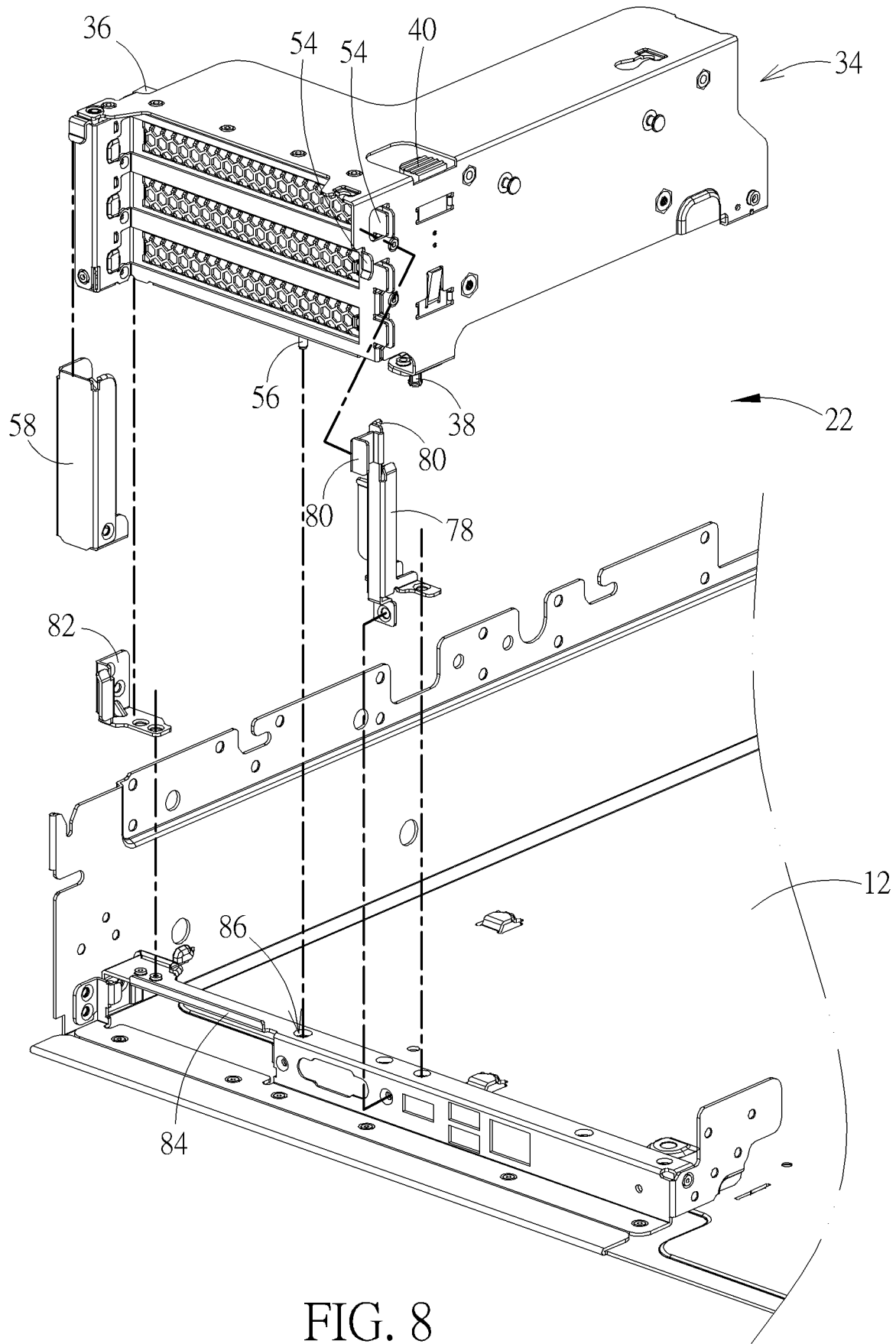
FIG. 8 and FIG. 9 are assembly diagrams of the fixing mechanism and a casing in different views according to the embodiment of the present disclosure.
Figure 9:
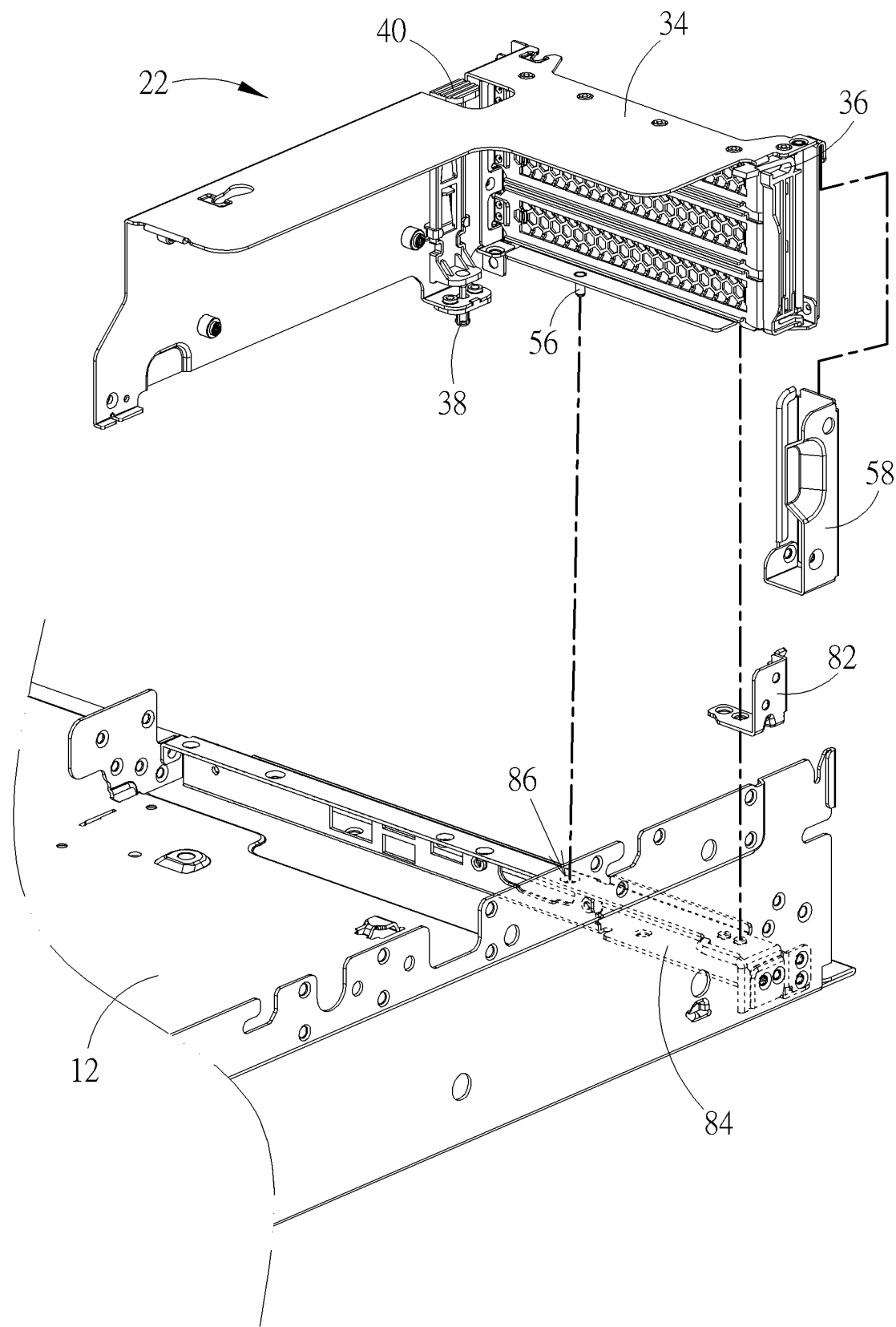

Please refer to FIG. 7 to FIG. 9. FIG. 7 is an assembly diagram of the fixing mechanism 22 and the first electronic component 14 according to the embodiment of the present disclosure. FIG. 8 and FIG. 9 are assembly diagrams of the fixing mechanism 22 and the casing 12 in different views according to the embodiment of the present disclosure. In this embodiment, a circuit board 62 having a connector 60 can be disposed on the second plate portion 44 of the detachable frame 34. For assembling the fixing mechanism 22 with the first electronic component 14, the constraining component 36 can be rotated from a closed position (such a solid line shown in FIG. 7) to an open position (such as a dotted line shown in FIG. 7), and then the first electronic component 14 can be laterally moved in a horizontal direction, so as to assemble with the detachable frame 34 via a slide slot or a guiding slot of the first plate portion 42. The first electronic component 14 can be moved close to the circuit board 62 and inserted into the connector 60. The circuit board 62 can be connected to the second electronic component 16, and therefore a signal transmission channel between the first electronic component 14 and the second electronic component 16 can be established via the circuit board 62. Final, the constraining component 36 can be switched from the open position (such as the dotted line shown in FIG. 7) to the closed position (such the solid line shown in FIG. 7) for abutting against an outside of the first electronic component; thus, a movement of the first electronic component 14 relative to the first plate portion 42 can be constrained accordingly.

As shown in FIG. 8 and FIG. 9, the casing 12 can include a supporting portion 78, and the supporting portion 78 can have several pushing structures 80. The pushing structures 80 respectively correspond to several guiding portions 54 of the detachable frame 34. When the detachable frame 34 is moved relative to the casing 12, the guiding portion 54 can slide along the pushing structures 80 for constraining a moving direction of the detachable frame 34, and ensuring the detachable frame 34 can be located at a correct position on the casing 12. The casing 12 can further include a restraining portion 82. The restraining portion 82 can be the L-typed single bending structure. An end of the restraining portion 82 can be fixed to a holder 84 of the casing 12, and the other end of the restraining portion 82 can be bent and set between the constraining component 36 and the resisting portion 58. The resisting portion 58 can slidably contact against the restraining portion 82 to constrain a movement of the detachable frame 34 relative to the casing 12 in a specific direction. The protruding portion 56 of the detachable frame 34 can be inserted into a piercing hole structure 86 formed on the casing 12 in a detachable manner, for constraining an assembly position of the detachable frame 34 on the casing 12. For assembling the fixing mechanism 22 with the casing 12, the protruding portion 56 can be accurately inserted into the piercing hole structure 86 via a combination of the guiding portion 54 and the supporting portion 78, and a combination of the resisting portion 58 and the restraining portion 82.

Figure 10:
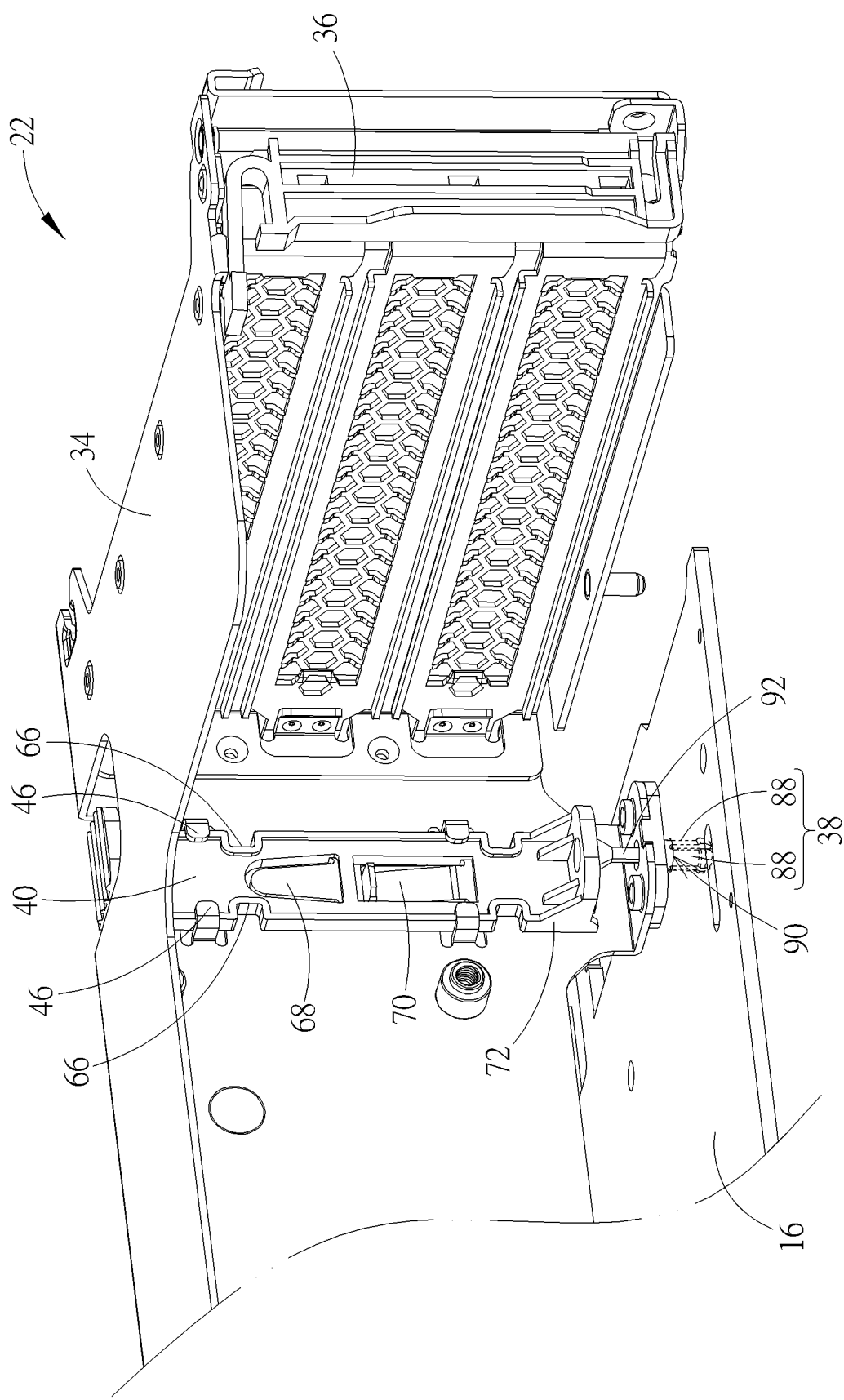
FIG. 10 and FIG. 11 are diagrams of the fixing mechanism in different operation modes according to the embodiment of the present disclosure.
Figure 11:
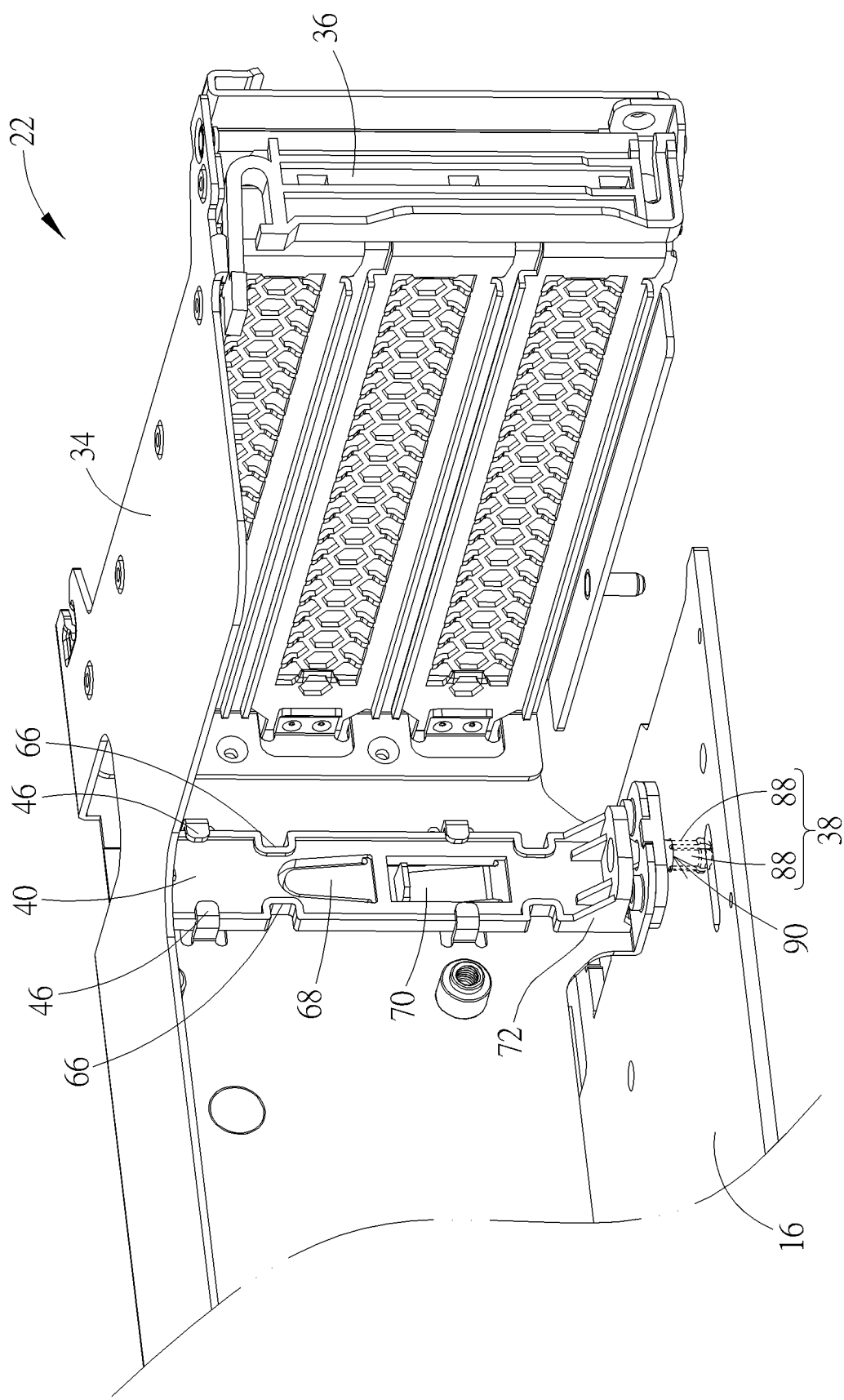
Figure 12:
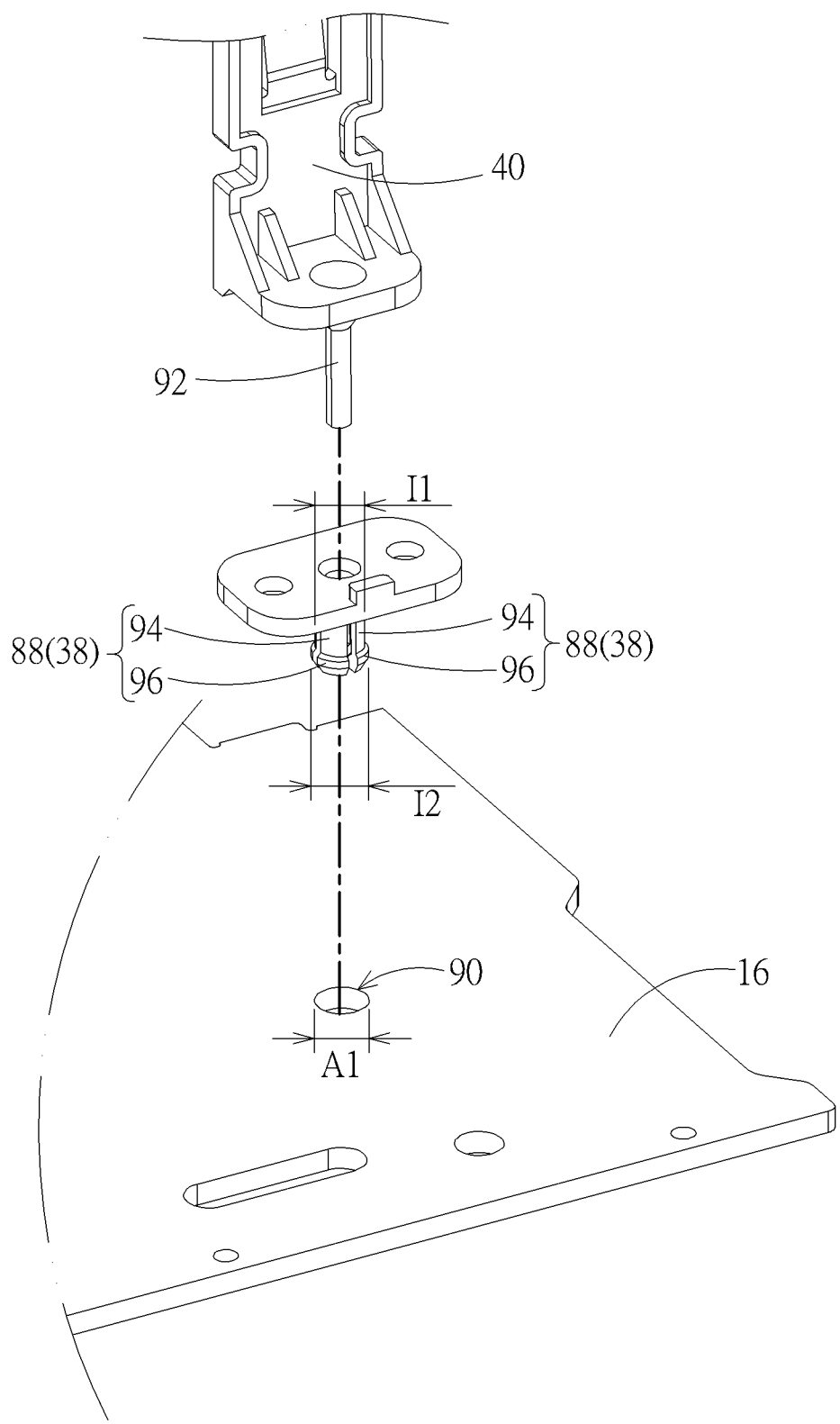
FIG. 12 is a partial enlarged diagram of the fixing mechanism according to the embodiment of the present disclosure.

Please refer to FIG. 5, FIG. 6, FIG. 10, FIG. 11 and FIG. 12. FIG. 10 and FIG. 11 are diagrams of the fixing mechanism 22 indifferent operation modes according to the embodiment of the present disclosure. FIG. 12 is a partial enlarged diagram of the fixing mechanism 22 according to the embodiment of the present disclosure. The combining component 38 can include a plurality of combining portions 88. In this embodiment, two combining portions 88 are located at symmetrical positions; however, an amount of the combining portions can be three or more, which depends on design demand. The combining component 38 can correspond to a connecting component 90 of the second electronic component 16. In this embodiment, the connecting component 90 can be a hole portion formed on the second electronic component 16. A circumference of outside surfaces of the plurality of combining portions 88 can be smaller than a hole diameter of the connecting component 90. The plurality of combining portions 88 can directly pass into the connecting component 90, as shown in FIG. 10. If the portion 92 of the actuating component 40 is inserted into the combining portions 88, the combining portions 88 can be pressed to result in resilient deformation, and the circumference of the outside surfaces of the combining portions 88 can be greater than the hole diameter of the connecting component 90, as shown in FIG. 11. The combining component 38 can be tightly engaged with the connecting component 90.

In the embodiment, the combining component 38 can be a resilient pin, and the connecting component 90 can be the hole portion. The resilient pin can be moved into or out of the hole portion for assembly and disassembly of the combining component 38 and the connecting component 90. Besides, the combining component 38 can be designed as the hole portion, and the connecting component 90 can be designed as the resilient pin. The combining component 38 can be moved closed to or away from the connecting component 90 for convenient assembly and disassembly about the combining component 38 and the connecting component 90. Structural design of the combining component 38 and the connecting component 90 is not limited to the above-mentioned embodiment, which depends on actual demand.

As shown in FIG. 12, each combining portion 88 can be a resilient hook including a stretching structure 94 and an inclined guiding structure 96 connected to each other. A distance l1 between outer surfaces of several stretching structures 94 can be smaller than an aperture A1 of the connecting component 90. When the combining portions 88 are not resiliently deformed, a distance l2 between outer surfaces of several inclined guiding structures 96 can be smaller than the aperture A1 of the connecting component 90; when the combining portions 88 are resiliently deformed, the distance l2 can be greater than the aperture A1 of the connecting component 90. Therefore, the combining portions 88 of the combining component 38 can be engaged with or disengaged from the hole portion of the connecting component 90 in response to the portion 92 being inserted and removed. Further, the distance l2 between the outer surfaces of the inclined guiding structures 96 can be greater than the aperture A1 of the connecting component 90 when the combining portions 88 are not resiliently deformed; as the combining component 38 is assembled with the connecting component 90, the inclined guiding structure 96 can contact against an inner wall of the connecting component 90 (such as the hole portion) to drive deformation of the stretching structure 94, and therefore the distance l2 can be smaller than the aperture A1 of the connecting component 90 to smoothly pass the combining portions 88 through the connecting component 90. When the portion 92 is set between the plurality of combining portions 88, the combining portions 88 are constrained and unable to generate resilient deformation, so that the combining component 38 can be tightly engaged with the connecting component 90.

The actuating component 40 can be moved relative to the detachable frame 34 for switching between the first position shown in FIG. 10 and the second position shown in FIG. 11. When the actuating component 40 is in the first position, the second engaging portion 68 can be engaged with the upper first engaging portion 48, and the second latching portion 70 can contact against the first latching portion 50 for preventing the actuating component 40 from being accidentally separated from the detachable frame 34. The portion 92 is not inserted into the combining portions 88, so that the combining component 38 is disengaged from the connecting component 90 or engaged with the connecting component 90 in a loose fit manner, and the handling portion 74 can align with a top plate whereon the opening structure 76 is disposed. When the actuating component 40 is pressed and moved from the first position to the second position, which means the handling portion 74 is located under the top plate whereon the opening structure 76 is disposed, the second engaging portion 68 can be disengaged from the upper first engaging portion 48 and then engaged with the lower first engaging portion 48, for providing preferred hand feeling. When the portion 92 is inserted into the combining portions 88, the combining component 38 can be engaged with the connecting component 90 in a tight fit manner. In addition, the handling portion 74 can be pulled to move the actuating component 40 from the second position to the first position, for disassembling the combining component 38 from the connecting component 90.

It should be mentioned that relation between the handling portion 74 and the top plate whereon the opening structure 76 is disposed is not limited to the above-mentioned embodiment. For example, when the actuating component 40 is in the first position, the handling portion 74 may protrude from the top plate whereon the opening structure 76 is disposed; when the actuating component 40 is moved from the first position to the second position, the handling portion 74 can align with or be located under the top plate whereon the opening structure 76 is disposed. Besides, when the actuating component 40 is in the first position, the handling portion 74 may be located under the top plate whereon the opening structure 76 is disposed; when the actuating component 40 is moved from the first position to the second position, the handling portion 74 may be located at a position deeper than before.

In conclusion, the electronic apparatus of the present disclosure can dispose the second electronic component inside the casing; the first electronic component can be assembled with the fixing mechanism for a start, and then electrically connected to the second electronic component because the fixing mechanism is installed inside the casing. The second electronic component can be a circuit board with common standard or specific standard. The fixing mechanism is designed for general purpose, and can be used to hold the first electronic component with any standard. As the first electronic component is a graphics processing unit (GPU), the detachable frame of the fixing mechanism can be used to hold one GPU. As the first electronic component is other interface card, the detachable frame may have one layer or plural layers for holding one or more interface cards. As a structural height of the detachable frame is changed, a length of the actuating component can be varied accordingly. The fixing mechanism of the present disclosure has advantages of simple structure and easy operation. The electronic apparatus can utilize the fixing mechanism to assemble the first electronic component with the second electronic component for economizing inner space of the casing. Moreover, the fixing mechanism can hold a variety of electronic components, so as to effectively increase market competition of the electronic apparatus.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fixing mechanism for fixing a first electronic component to a second electronic component having a connecting component, the fixing mechanism comprising:

a detachable frame whereon the first electronic component is disposed, the detachable frame comprising at least one hooking portion;
   a combining component disposed on the detachable frame and corresponding to the connecting component; and
   an actuating component movably disposed on the detachable frame for being moved between a first position and a second position, the combining component being disassembled from the connecting component in response to the actuating component located at the first position, and the combining component being assembled with the connecting component in response to the actuating component located at the second position, the actuating component being partly covered by the at least one hooking portion and able to move linearly relative to the detachable frame via the at least one hooking portion.

2. The fixing mechanism of claim 1, wherein the combining component comprises at least two combining portions, the connecting component is a hole portion disposed on the second electronic component, a portion of the actuating component is inserted into the at least two combining portions to engage the at least two combining portions with the hole portion and the portion of the actuating component is located between the at least two combining portions in response to the actuating component located at the second position.

3. The fixing mechanism of claim 2, wherein each of the at least two combining portions is a resilient hook, and the portion of the actuating component is a pin.

4. The fixing mechanism of claim 1, wherein the detachable frame comprises two hooking portions, the actuating component comprises a main body and a slot portion, a width of the main body is greater than a distance between the two hooking portions, the slot portion is disposed on a lateral side of the main body, and the main body is installed between the two hooking portions via the slot portion.

5. The fixing mechanism of claim 1, wherein the detachable frame comprises two first engaging portions, the actuating component comprises a main body and a second engaging portion, an end of the second engaging portion is connected to the main body, and the other end of the second engaging portion is engaged with one of the two first engaging portions in a detachable manner.

6. The fixing mechanism of claim 1, wherein the detachable frame comprises a first latching portion, the actuating component comprises a main body and a second latching portion, an end of the second latching portion is connected to the main body, and the other end of the second latching portion is engaged with the first latching portion to set the actuating component on a specific position of the detachable frame.

7. The fixing mechanism of claim 1, wherein the detachable frame comprises a first contacting portion, the actuating component comprises a main body and a second contacting portion, the second contacting portion is disposed on a bottom of the main body and used to contact against the first contacting portion for constraining a movement of the actuating component relative to the detachable frame.

8. The fixing mechanism of claim 1, wherein the detachable frame comprises a first plate portion and a second plate portion connected to each other in a bending manner, the first electronic component is disposed on the detachable frame via the first plate portion, a circuit board having a connector is disposed on the second plate portion, the first electronic component is assembled with the first plate portion and inserted into the connector, and the actuating component is disposed on the second plate portion and able to move linearly relative to the second plate portion.

9. The fixing mechanism of claim 1, wherein the detachable frame comprises at least one guiding portion, a protruding portion and a resisting portion, the guiding portion slidably contacts against a supporting portion of a casing to assemble with the casing, the protruding portion is movably inserted into a piercing hole structure of the casing to position the detachable frame onto the casing, the resisting portion is used to contact against a restraining portion of the casing to restrain a movement of the detachable frame relative to the casing.

10. The fixing mechanism of claim 1, wherein the actuating component drives the combining component to engage with the connecting component in a tight fit manner when the actuating component is located at the second position, the actuating component comprises a main body and a handling portion, the handling portion is connected to the main body in a bending manner, the handling portion is driven by an external force to move the actuating component between the first position and the second position, the detachable frame comprises an opening structure, and a position of the opening structure corresponds to a position of the handling portion.

11. An electronic apparatus, comprising:
  a casing;
  a first electronic component;
  a second electronic component disposed inside the casing and having a connecting component; and
  a fixing mechanism for fixing the first electronic component to the second electronic component, the fixing mechanism comprising:
    a detachable frame whereon the first electronic component is disposed, the detachable frame comprising at least one hooking portion;
    a combining component disposed on the detachable frame and corresponding to the connecting component; and
    an actuating component movably disposed on the detachable frame for being moved between a first position and a second position, the combining component being disassembled from the connecting component in response to the actuating component located at the first position, and the combining component being assembled with the connecting component in response to the actuating component located at the second position, the actuating component being partly covered by the at least one hooking portion and able to move linearly relative to the detachable frame via the at least one hooking portion.

12. The electronic apparatus of claim 11, wherein the combining component comprises at least two combining portions, the connecting component is a hole portion disposed on the second electronic component, a portion of the actuating component is inserted into the at least two combining portions to engage the at least two combining portions with the hole portion and the portion of the actuating component is located between the at least two combining portions in response to the actuating component located at the second position.

13. The electronic apparatus of claim 12, wherein each of the at least two combining portions is a resilient hook, and the portion of the actuating component is a pin.

14. The electronic apparatus of claim 11, wherein the detachable frame comprises two hooking portions, the actuating component comprises a main body and a slot portion, a width of the main body is greater than a distance between the two hooking portions, the slot portion is disposed on a lateral side of the main body, and the main body is installed between the two hooking portions via the slot portion.

15. The electronic apparatus of claim 11, wherein the detachable frame comprises two first engaging portions, the actuating component comprises a main body and a second engaging portion, an end of the second engaging portion is connected to the main body, and the other end of the second engaging portion is engaged with one of the two first engaging portions in a detachable manner.

16. The electronic apparatus of claim 11, wherein the detachable frame comprises a first latching portion, the actuating component comprises a main body and a second latching portion, an end of the second latching portion is connected to the main body, and the other end of the second latching portion is engaged with the first latching portion to set the actuating component on a specific position of the detachable frame.

17. The electronic apparatus of claim 11, wherein the detachable frame comprises a first contacting portion, the actuating component comprises a main body and a second contacting portion, the second contacting portion is disposed on a bottom of the main body and used to contact against the first contacting portion for constraining a movement of the actuating component relative to the detachable frame.

18. The electronic apparatus of claim 11, wherein the detachable frame comprises a first plate portion and a second plate portion connected to each other in a bending manner, the first electronic component is disposed on the detachable frame via the first plate portion, a circuit board having a connector is disposed on the second plate portion, the first electronic component is assembled with the first plate portion and inserted into the connector, and the actuating component is disposed on the second plate portion and able to move linearly relative to the second plate portion.

19. The electronic apparatus of claim 11, wherein the casing comprises a supporting portion, a piercing hole structure and a restraining portion, the detachable frame comprises at least one guiding portion, a protruding portion and a resisting portion, the guiding portion slidably contacts against the supporting portion to assemble with the casing, the protruding portion is movably inserted into the piercing hole structure to position the detachable frame onto the casing, the resisting portion is used to contact against the restraining portion to restrain a movement of the detachable frame relative to the casing.

20. The electronic apparatus of claim 11, wherein the actuating component drives the combining component to engage with the connecting component in a tight fit manner when the actuating component is located at the second position, the actuating component comprises a main body and a handling portion, the handling portion is connected to the main body in a bending manner, the handling portion is driven by an external force to move the actuating component between the first position and the second position, the detachable frame comprises an opening structure, and a position of the opening structure corresponds to a position of the handling portion.

* * * * *